United States Patent [19]

Brown

[11] 4,412,178
[45] Oct. 25, 1983

[54] COMPUTER-CONTROLLED, PORTABLE PULSED NMR INSTRUMENT AND METHOD OF USE WHEREIN A DC MAGNETIC FIELD GRADIENT IS ARTIFICIALLY INTRODUCED

[75] Inventor: Robert J. S. Brown, Fullerton, Calif.

[73] Assignee: Chevron Research Company, San Francisco, Calif.

[21] Appl. No.: 255,975

[22] Filed: Apr. 15, 1981

[51] Int. Cl.³ .............................................. G01N 27/00
[52] U.S. Cl. ...................................... 324/303; 324/313
[58] Field of Search ............... 324/303, 307, 311, 313, 324/314

[56] References Cited

U.S. PATENT DOCUMENTS

| | | | |
|---|---|---|---|
| 3,052,834 | 9/1962 | Schuster | 324/313 |
| 3,714,551 | 1/1973 | Pajak | 324/313 |
| 4,214,202 | 7/1980 | Bonori | 324/313 |

Primary Examiner—Michael J. Tokar
Attorney, Agent, or Firm—H. D. Messner; Edward J. Keeling

[57] ABSTRACT

In accordance with the present invention, fluid-flow properties of a rock sample based on NMR response of the hydrogen nuclei of interstitial fluids within the pore space of such sample, can be swiftly and accurately achieved using a computer-controlled, portable NMR instrument. The inherent instrument inadequacy of phase background jitter is controllably augmented by generating (via a computer-initiated DC source current) a DC magnetic field gradient across the sample. Result: A DC field inhomogeneity of D gauss is discontinuously introduced to the steady DC field to maintain high data-throughput efficiency, i.e., the number of NMR responses performed per unit time. And, even though the instrument is placed at field sites away from the usual processing center, quick analysis of rock samples as during the drilling of a well, still occurs.

16 Claims, 3 Drawing Figures

FIG _ 1

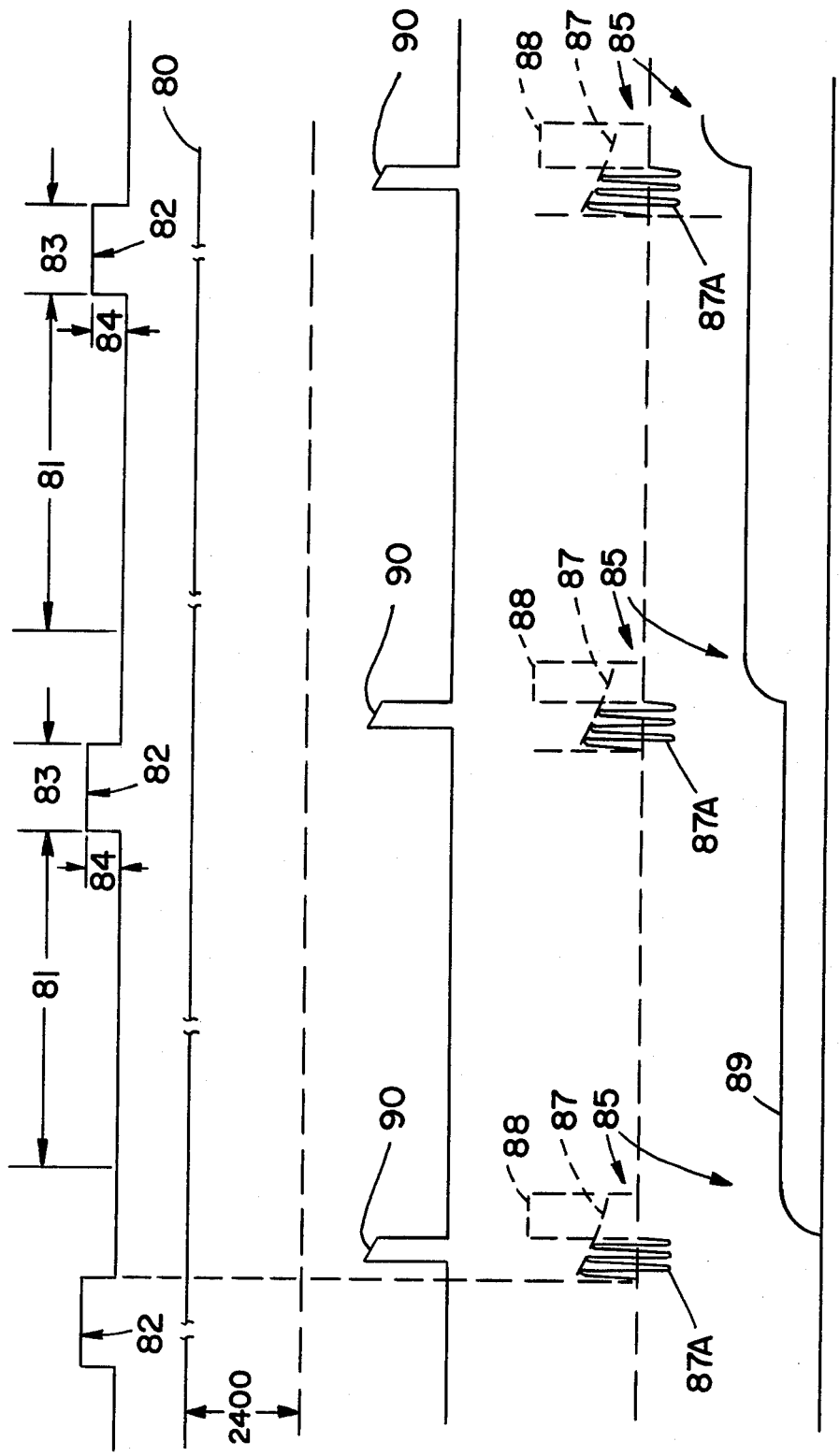
FIG_3

COMPUTER-CONTROLLED, PORTABLE PULSED NMR INSTRUMENT AND METHOD OF USE WHEREIN A DC MAGNETIC FIELD GRADIENT IS ARTIFICIALLY INTRODUCED

SCOPE OF THE INVENTION

This invention relates to a method and apparatus for determining physical properties of porous media and more particularly to the swift indication of fluid-flow properties of ultrasmall samples of such media by a computer-controlled, small, portable NMR instrument. In accordance with the present invention, an inherent inadequacy of the instrument, viz, the presence of background phasal incoherence, i.e., circuit jitter, is controllably augmented by placing (via computer-initiated control pulses) magnetic field gradients across the sample. Result: A DC field inhomogeneity of D gauss is artificially introduced to the usual steady DC magnetic field and high flow-through efficiency of the instrument is maintained, i.e., the number of NMR responses provided per unit time. Flow properties of the sample including porosity, permeability and recoverable fluid content can likewise be quickly estimated irrespective of instrument and operator location.

BACKGROUND OF THE INVENTION

In my prior applications, op. cit., I describe using a portable NMR instrument so that flow properties of rock samples can be accurately and swiftly measured, especially at remote field sites. The described principle of operation:spin-lattice relaxation times of fluids in chip samples, can be accurately correlated with flow properties of different rock samples. However, in a limited number of occasions related exclusively to field use of newer instruments, problems have arisen. These problems relate mainly to the fact that such instruments do not have the operating characteristics on which I based my prior advances: large DC field inhomogeneity and unusual background phase incoherence. In such instruments, I now find that at least one of the above-mentioned inherent conditions has been eliminated.

SUMMARY OF THE INVENTION

In accordance with the present invention, fluid-flow properties of rock samples based on NMR response of the hydrogen nuclei of interstitial fluids within the pore space of such samples, can be swiftly and accurately achieved using a computer-controlled, portable NMR instrument. In the invention, an inherent condition of the instrument (large phase background jitter) is controllably augmented by the generation (via a computer-initiated DC source circuit) of a DC magnetic field gradient across the sample. Result: A DC field inhomogeneity of D gauss is artificially introduced to the steady DC field to maintain high data-throughput efficiency, i.e., the number of NMR responses available per unit time. And, even though the instrument is placed at field sites away from the usual processing center, quick analysis of rock samples as during the drilling of a well, still results.

DETAILED DESCRIPTION OF THE DRAWINGS

FIG. 3 is a timing diagram illustrating the method of the present invention.

DESCRIPTIONS OF PREFERRED EMBODIMENTS

Figure 1:
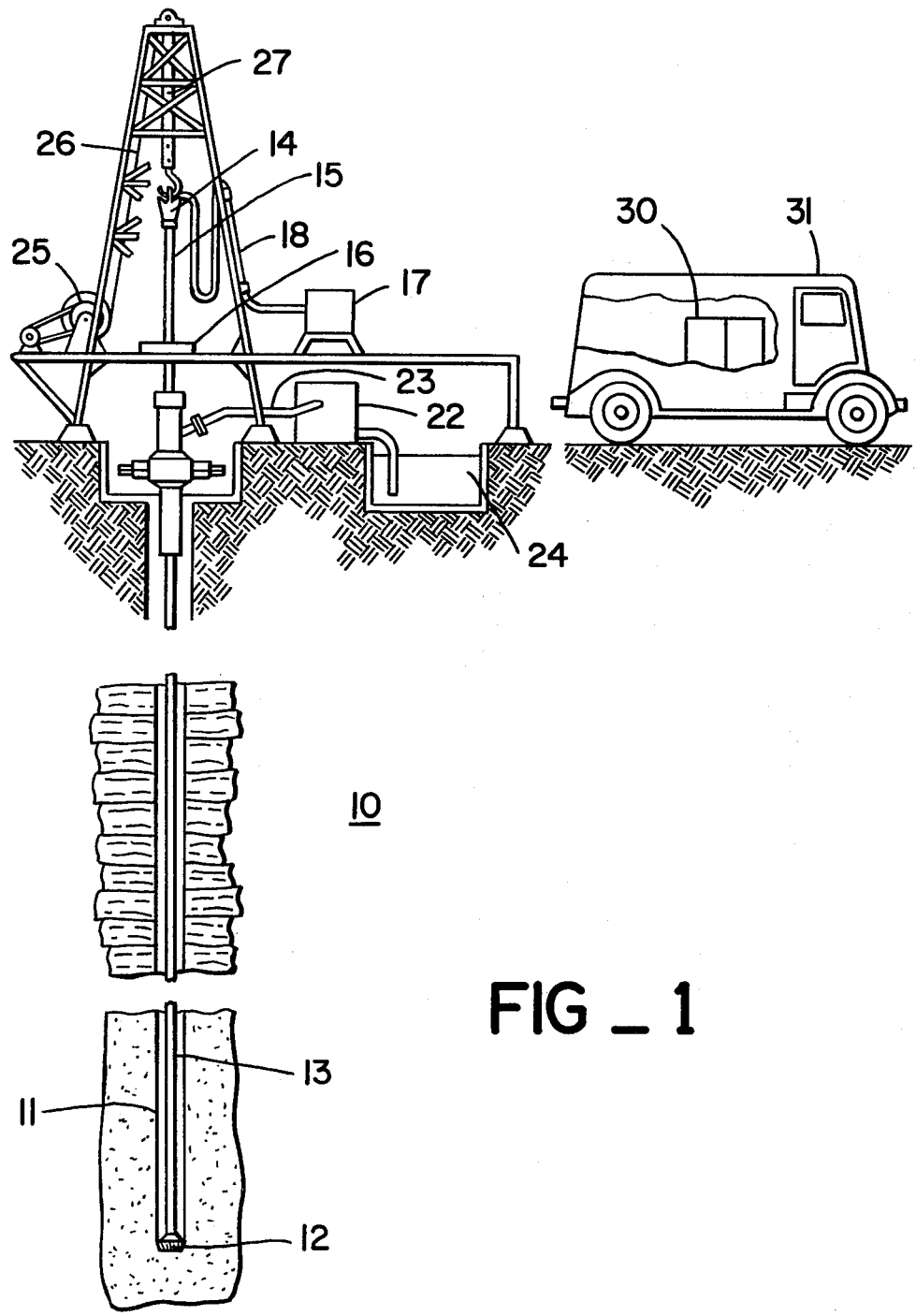
FIG. 1 illustrates a well drilling environment in which a computer-controlled pulsed NMR instrument and method of the present invention has use.

FIG. 1 depicts an environment in which the present invention is particularly useful, viz, in the measurement of fluid-producing potential of an earth formation such as earth formation 10 penetrated by wellbore 11, by determining its fluid-flow properties from NMR responses of chips associated with formation 10. Such chips are produced by a drill bit 12 rotating within the wellbore 11. As shown, drill string 13 attaches to swivel 14 via Kelly bar 15 and rotary drill table 16. As the latter rotates, so does the drill bit 12. Result: Drill chips accumulate at the bottom of the wellbore 13.

In order to bring the rock chips from the bottom of the wellbore 11 as well as to cool the bed 13, conventional drilling technology employs a drilling fluid 14. The fluid 14 continuously circulates in the wellbore 11 after its continuous introduction uphole at the surface of the formation 10.

Formation of the drilling fluid is at a mixer 17. When properly mixed, the fluid passes via line 18, swivel 14, and Kelly bar 15 and thence down drill string 13. After exiting from the drill string 13, the fluid cools the drill bit 12 as well as picks up rock chips at the bottom of the wellbore 11. It next travels up the annulus 20 (between the sidewall 21 of the wellbore 11 and the drill string 13) and exits uphole via line 23 to a Blooie box 22. After various levels of separation have occurred in the box 22, the fluid comes to rest at sump 24. Rock chips previously entrained in the fluid 14 are quickly gathered, and after brief preparation, as explained below, are analyzed at the well site by a pulsed NMR instrument 30 located within truck 31. The purpose of such analysis: to determine the fluid-producing potential of the earth formation 10 in a quick and accurate manner.

Of importance is the annotation of the rock samples with the drilling depth of drill bit 12. Such information can be gathered from a shieve 25 attached to swivel 14 via cable 26 and support bar 27.

It should be apparent that quick evaluation of the fluid-producing potential of the earth formation 10 is exceedingly helpful to the field operator. For example, the operator is interested in quickly determining the following: if the rock samples have the necessary porosity associated with quantities of petroleum; if they have the necessary permeability to permit the fluid contents to flow towards possible producing wells; and whether or not the rock samples contained (in-situ) fluids of interest.

Then decisions can be made at the well site about, e.g., when to change from straight drilling to coring, when to run logs and when to make formation tests without the necessity of time-consuming trips formerly required when samples had to be taken or sent to distant laboratories for NML evaluation.

Figure 2:
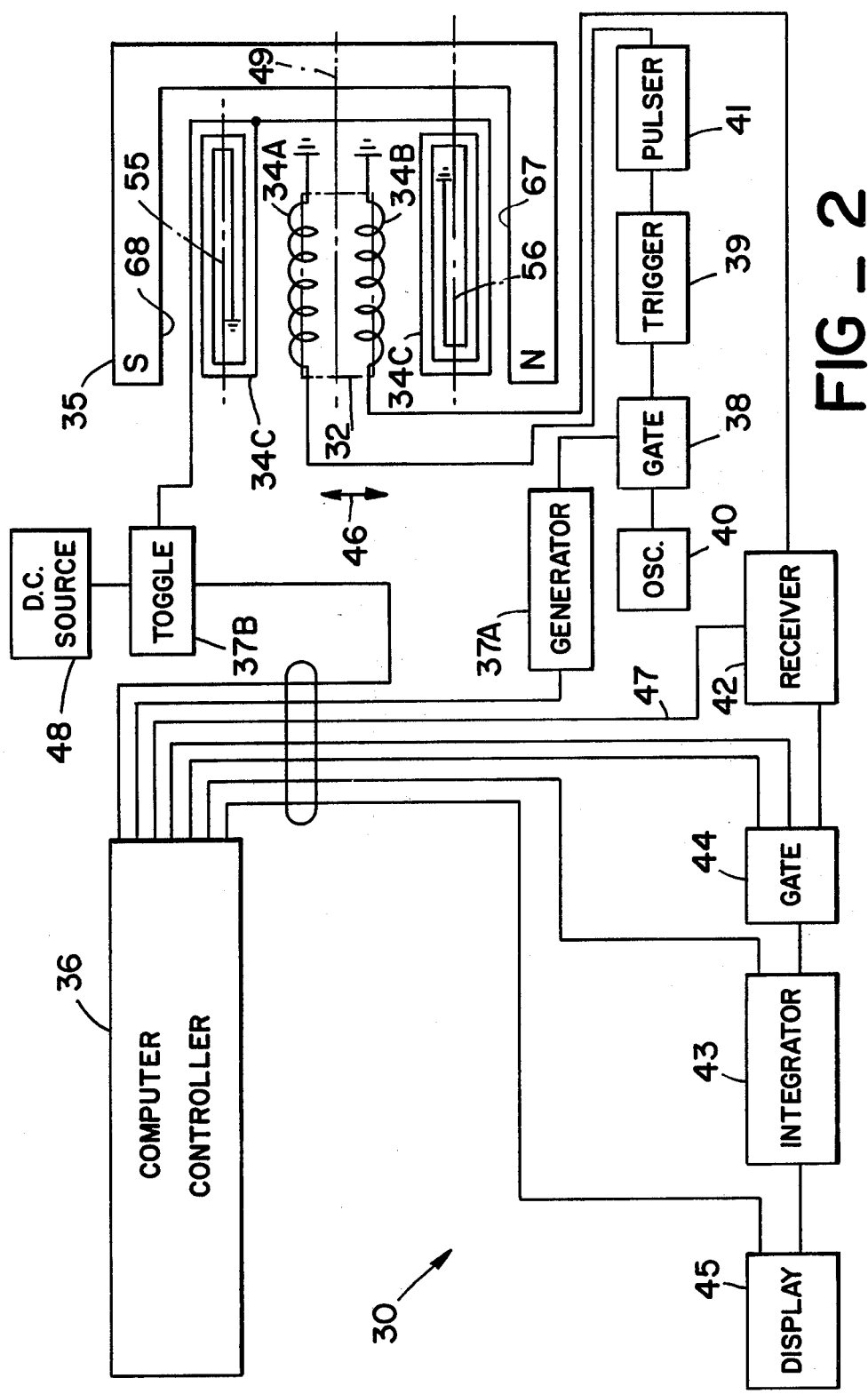
FIG. 2 illustrates in block form the apparatus of FIG. 1 for testing of ultrasmall samples of a porous earth formation in accordance with the present invention.

Attention is now directed to FIG. 2 in which computer-controlled pulsed NMR instrument 30 of the present invention is shown in more detail.

NMR instrument 30 incorporates many usual elements, e.g., a sample holder 32 (shown in phantom line) into which the rock chips are placed. Mechanically, the holder 32 is only symbolically illustrated since it is manditorily surrounded by co-extensive and colinear coils 34A and 34B at right angles to a DC field of magnet 35, and by elongated DC magnetic gradient coils 34C. (For didactic purposes, while coils 34C are shown with axes of symmetry 55 and 56 parallel to axis of symmetry 49 of holder 32, but offset to each side; in point of fact such axes 55 and 56 are co-linear of and co-extensive with the axis 49, as are axes of symmetry of coils 34A and 34B.)

Timed operations are determined by computer-controller 36. The computer-controller 36 generates, inter alia, a series of digital control codes (signals). The codes are in bit form. Their flow pattern is via 90° pulse generator 37A, toggle gate 37B, network 38 and circuit 39. Their ultimate purpose is to control operations of associated circuitry, including the output of oscillator 40 and hence the triggering of pulser 41 as well as the gating of DC source 48 and hence the generating of a magnetic field gradient across the holder 32. (As a consequence of the latter, a DC field inhomogeneity of at least D gauss is created).

Pulser 41 in effect "interrogates" the sample by generating a series of magnetic pulses oscillating at the Larmor frequency for hydrogen nuclei in the DC field of magnet 35. Result: A series of NMR responses associated with a succession of magnetization build-ups in the DC field of magnet 35, can be indicated via receiver 42 and associated circuitry.

At integrator 43, e.g., each nuclear magnetization signal is monitored and stored (via capacitor charging circuits) under direction of pulse codes provided by computer-controller 36, say, at gate 44, as previously mentioned. The NMR signals are ultimately displayed at display 45. These signals first undergo normalization. Hence, they represent only magnetization build-up within an average time interval (not the total time for all polarizing intervals), between interrogation pulses.

Operations of the computer-controller 36 are, of course, also communicated to receiver 42 and integrator 43 to key their operations as well as that of display 45, as indicated below, via additional pulse codes.

Before discussing operations of instrument 30 of FIG. 2 in more detail, a review of key NMR terminology may be beneficial and is presented below.

Nuclear Magnetization, Dipole Moments Polarization and Relaxation

Hydrogen nuclei of entrained fluids of the rock samples within the holder 32 have magnetic dipole moments which produce magnetic fields somewhat like those of tiny magnets. Were it not for the fact that the moments are within the influence of the DC field of magnet 35, their fields would be randomly oriented and not produce an observable external magnetic field. But since they are subjected to such DC field, their associated magnetic fields become aligned with the DC field, say in direction of arrow 46. At the same time, a scrambling effect due to thermal motion is produced. It tends to prevent such alignment. Result: A slightly preferential alignment in the direction of the arrow 46 (called the "polarization") occurs. Note that the polarization is proportional to the strength of the DC field of magnet 35 that causes the alignment but inversely proportional to absolute temperature, the latter being a measure of thermal motion tended to scramble the system of nuclear magnetic moments.

The nuclear magnetization corresponds to the polarization, and produces a magnetic field which can be detected. Note that the nuclear magnetization does not immediately occur when the DC field is applied nor does it decay immediately when the DC field is removed or vice versa as when the holder 32 (with samples therein) is placed in or removed from the steady-state DC field of magnet 35. The process of the approach of the nuclear magnetization to its new equilibrium value when the magnetic field is changed is called "relaxation" and the corresponding times are called "relaxation times."

Precession

In addition to being little magnets, fluid nuclei within the holder 32, are also like little gyroscopes, and the applied DC magnetic field of the magnet 35 will twist them just as gravity twists a spinning top. Result: The nuclei precess. That is, they precess unless they are aligned with the DC magnetic field just as the toy top precesses so long as it is not aligned with the earth's field of gravity.

Detection of Precession

A precessing nuclear magnetization produces a rotating magnetic field which in turn generates electric signals which can be detected. Precessional frequencies are directly proportional to the strength of the twist causing the precession, that is to say, it is directly proportional to the strength of applied DC magnetic field of the magnet 35, and the precessional frequency is 4.2577 kilohertz per gauss of applied DC field for hydrogen nuclei of interest.

Conditions for Precession

Two things must be present to obtain a precessing nuclear magnetization: First, the magnetization must be produced, by the placement of holder 32 (with sample) in the DC magnetic field provided by manget 35 for an appropriate length of time. Second, the magnetization and magnetic DC field must somehow be made not parallel to each other as by (i) manipulating the magnetic fields to reorient the nuclear magnetization, or (ii) reorienting the magnetic fields so that the magnetization is subjected to a magnetic field in a new direction.

In nuclear magnetism logging, the concept set forth in item (ii) is used, i.e., proton precession is caused to take place in the earth's field after the nuclear magnetization has been generated in a direction in the borehole perpendicular to the earth's field; when the polarizing field is cut off, the magnetization is left to precess about the earth's field.

In pulsed NMR technology, the opposite is done. The magnetization is first generated by means of the permanent magnet 35 in the direction of arrow 46 and then it is reoriented by means of briefly applied radio-frequency magnetic fields at right angles to the DC field via coil 34A, and then it is allowed to precess about the DC field.

Conditions for RF Reorientation of the Magnetization

A convenient way to visualize reorientation of the nuclear magnetization associated with the hydrogen nuclei within the holder 32 is via the analogous use of a rotating frame of reference.

It can be shown mathematically and is plausible intuitively that assuming a reference frame rotating with the same frequency as that of the RF magnetic field applied via coil 34A to cause precession, then in the rotating frame the reorientation of the nuclear magnetization occurs as if certain magnetic fields were cancelled. If additional fields are present (other than those apparently cancelled), then it may be easy to visualize their effect.

As a simple example, assume that a reference frame rotates at exactly the precessional frequency of the nuclear magnetization in the DC field of the permanent magnet 35. Then in the rotating frame the magnetization is apparently not subject to the action of any magnetic field at all. As the oscillating RF field (via coil 34A) is applied exactly at the precessional frequency of the hydrogen nuclei (again, being exactly the frequency with which the reference frame rotates), the oscillating RF field, in effect, consists of two rotating fields. Each has half the amplitude of the oscillating field and rotates in opposite directions. Result: Their components perpendicular to the oscillating field cancel, while their components parallel to the oscillating field add so that each equal to half the oscillating field. One of these rotating fields appears to stand still, that is, the one that is rotating the same way as is the reference frame, and causes a steady precession of the nuclear magnetization about it. But, the one rotating the other way now appears to rotate twice as fast, and alternates directions so rapidly that it has no effect.

Quantitative Example

Consider that 20 gauss is the strength of the RF field applied via the coil 34A at right angles to the DC field of magnet 35. Thus, the strength of a rotating component is B 10 gauss. Consider also that the DC field of the magnet 35 (about 2400 gauss) is absent in the rotating frame of reference leaving what appears to be a static field of 10 gauss (plus another 10 gauss field rotating so fast it is ineffectual), acting in the direction of arrow 46. The nuclear magnetization precesses about the 10 gauss field (turns about this field as an axis) at a frequency of 42577 hertz (10 gauss×4257.7 hertz per gauss) corresponding to a period of 23.5 microseconds.

If the RF field is applied for 23.5 microseconds, the magnetization would have precessed one full cycle, and would be oriented just as it was before application of the RF field by the coil 34A. However, suppose the RF pulse of the coil 34A is supplied just under 6 microseconds. Then, the magnetization initially parallel to the DC field, precesses about a quarter cycle (90° in the rotating frame end), leaving the magnetization at right angles to the strong DC field. Since it is at right angles when the RF pulse terminates, conditions necessary for magnetization precession exists. Result: An NMR response is established. Such responses can be averaged over a series of polarizing times, provided there is rapid coordination of operations under management via computer-controller 36. While at the same time, care must be taken to take into account the twin effects of DC field inhomogeneity and phase incoherency inherent in rapid NMR measurements.

FIG. 3 illustrates operations of the present invention by comparing—on a time basis—the relationship of control signals generated by computer-controller 36 and the effect of such signals at associated circuitry.

It should first be recalled from FIG. 2 that the computer-controller 36 generates at least three series of pulse codes (in bit form). At least one set of code is associated with the generation of interrogation pulses 82 of FIG. 3. Such code indirectly supervises conventional output characteristics such as pulse width 83 and pulse amplitude 84 (via pulse generator 37A); also note the frequency of oscillations (at the Larmor frequency of hydrogen nuclei) is a direct function of pulser 41 and its associated circuitry. Another set of control code is introduced to control toggle 37B to permit current flow—on a pulsed basis—to the gradient coils 34C to more or less coincide with the time windows 88 when NMR detection is to occur. In that way, a series of DC gradient fields 90, FIG. 3, can be generated to cause DC magnetic field 80 of FIG. 3 to have associated therewith, a DC inhomogeneity of D gauss. Since it is also discontinuously applied, interference with interrogation pulses 82 is minimized. Still another set of code relates to the detection of the resulting NMR signals.

Of particular importance in this regard is the high degree of control exercised over the time windows 88 of FIG. 3 via the code of the computer-controller 36. Key to operation: The fact that since such series of control codes can be easily used to divide the time domain associated with the windows 88 into a plurality of subintervals, it is a simple matter to have each window 88 open a selected number of sub-intervals after cessation of each interrogation pulse 82 as well as close, on command, after a second number of intervals has passed; then the next-in-time polarizing interval 81 of FIG. 3 begins anew. Each interval 81, of course, individually provides for build-up of the magnetization so that relaxation characteristics 85 can be established.

Of probable greater importance—from a control standpoint—however, is the fact that the control codes must directly maintain the integrity of the selected polarizing and detection periods for the correct number of times per measuring cycle. In that way, operations can proceed on a correct iterative basis from level to level, without interruption.

For example, assume four series of polarizing periods (each series akin to the polarizing period 81 of FIG. 3) are to be used, and say these polarizing periods are 10, 20, 30 and 40 milliseconds respectfully. Since the RF magnetic pulse width 83 for each series is essentially constant (about equal to 4.5 microseconds), the time span between such series of the RF pulses 82 would be equal to the aforementioned 10, 20, 30 or 40 milliseconds.

Assume also that each polarizing period 81 is to be repeated 20 times. That is to say, each NMR response 85 associated with a respective 10, 20, 30 or 40 millisecond polarizing period, is to be repeated 20 times before the next operational level occurs. Thus, the computer-controller 36 would essentially track two variables: (1) time increments within the preset polarizing periods of 10, 20, 30 or 40 milliseconds, and (2) the iterative number of polarizing periods within the maximum allowed 20 NMR periods needed per measuring cycle.

Result: The number of magnetization build-ups (due to the DC magnetization field 80 of magnet 35 acting on the hydrogen nuclei) can be counted, and the associated NMR responses 85 can be recorded in a highly accurate manner. For example, when the counts of a controlling counter (of the computer-controller 36) match a count setting at a particular operational level, a supervising register (similarly located) decrements its pre-existing count setting by ONE; resets the controlling counter to zero while simultaneously activating the generator 37A to open gate 38. Result: Pulser 41 is activated to provide a correct NMR environment for response. Just prior in time, toggle 37B is activated, permitting DC current to flow to coils 34C as to provide the prerequisite magnetic field gradient across the sample to assure the DC field inhomogeneity required for operation.

The computer-controller 36 then iterates its operations' code to allow the process to be repeated and then to be re-repeated until the decremented count at the supervising register has reached a zero count value. Then at that occurrence (at the occurrence of the 20-in-20th measuring increment), a new supervising register count can be triggered to initiate operations of the next level of the operations whereby a new series of NMR responses for any magnetization period 81, of say 20, 30 or 40 milliseconds, is rapidly provided. The process continues until the lowest level of the cycle is reached at which time operations terminate.

Since receiver 42 preferably includes diode rectification subcircuitry, the signal output 85 of the receiver 42 of FIG. 3 is only an envelope 87 of the positive peaks of the precessional signals 87A, not their absolute values. That is to say, responses 85 of FIG. 3 are first seen as signals 87 (associated with receiver 42) and next seen as signals 89 (associated with integrator 43). Signals 89, of course, result from positive rectification of the decaying precessional signals 87 over the time window 88 and can represent feedback operations of an operational amplifier incrementally charging a capacitor to a peak amount proportional to the integrated rectified voltage produced during signal gates at the receiver 42. Only after the repetitive measuring cycle has been completed, say 20 repetitions, does the capacitor become discharged. Its ultimate value (as well as intermediate values) are indicated at display 45 as a cumulative display.

I.e., to say the display at display 45 is normalized by dividing the total display count by the number of measuring repetitions, and the ultimate value is held for display as long as required, usually until a reset signal (see FIG. 2) is received from the computer-controller 36 to initiate a new cycle. During that period, a hard-copy printer or a tape recorder (not shown) can be used to record the display, if desired.

Note in this regard that since coils 34A and 34B are co-extensive, they also are, unfortunately, interactive. I.e., when coil 34A radiates RF pulses 82, such pulses are also detected at coil 34B (and receiver 42). Hence, a need exits to disable receiver 42 for selected sub-intervals of time via line 47 connected to the computer-controller 36 which cooperatively function to "blank off" the receiver 42 as the transmitter-pulser 41 is activated.

Further refinements in the timing of operations can also be provided by the computer-controller 36 at, say gate 44 which provides a synchronizing function. Result: generation of particular and repetitive time windows 88 over which the amplitude magnetization per unit time can be measured. Although the time frame of the windows 88 is constant within the measuring cycle, it can be lengthened (time-shifted) as desired, e.g., the computer-controller 36 can accurately control both the delay times and polarizing intervals so that each series of time windows 88 opens a preselected time increment after the transmitter-pulser 41 has been activated, as well as closes at the appropriate time, say as measured from zero-crossing of the same pulser output. Result: The magnetization build-up over the time windows 88 can be properly gated to an integrator 43 where amplitude accumulation over the repeated measuring cycle occurs. That is to say, the amplitude per window increment is accumulated at the integrator 43 for the entire 20 NMR measuring periods. Then as dictated by a change in operational level within the computer-controller 36, the integrator 43 is reset to zero, and a new measuring cycle begins.

In order to further understand the complexity of providing a series of polarizing periods 81 intermixed with a plurality of RF field pulses 82, the effect of generating a DC gradient field across the sample to create an artificial DC field inhomogeneity of D gauss must be described.

Both the DC magnetic field 80 and the RF field 82 are inhomogeneous in space. That is, not all of the nuclei within the holder 32 experience the same DC field or the same RF field. Result: Even if the RF frequency is correctly tuned so that the DC field is exactly cancelled for one point in the sample volume, there will be other nuclei in the sample where the DC field is under-cancelled or overcancelled. That is to say, if the volume in the sample in holder 32 is large compared to DC field variation, the sample volume will experience different DC fields from part-to-part within the volume, resulting in under- or over-cancelled DC field components in the rotating frame of reference with an associated variation in the rate of precession.

While in most circumstances, DC field inhomogeneity is undesirable (with usual precautions being desirable such as having pole faces 67 and 68 extend beyond the ends of holder 32), some degree of inhomogeneity is required in accordance with the present invention. Such requirements do not, however, foster inaccurate results because of the following:

(1) Note that the volume of holder 32 of the present invention is very small ($\pi \times$ the diameter $\times$ the length of the sample) compared to the discontinuous DC inhomogeneity gradient D.

(2) Also note that the RF field pulse amplitudes 84 of the interrogation pulses 82 are larger in magnitude compared to the over- and under-cancelled field components discussed above. That is, the amplitude of the RF pulse 82 in FIG. 4 is maintained at a value that is substantially greater than the variation D in the DC field over the sample volume as artificially provided by DC field pulses 90.

After termination of each RF pulse 82, effects of DC inhomogeneity linger on, however, especially related to the precession of the nuclear magnetization. But in accordance with the present invention, the above condition does not depreciate results but becomes a necessary variable in the correct operation of the entire system. When such field condition is not inherently provided, it must be directly generated as via the gradient coils 34C to produce DC gradient fields 90.

In more detail, during polarization 81 by the DC field, the build-up magnetization being a vector quantity can be resolved into components parallel to and perpendicular to the DC field. The component parallel to the DC field does not precess because the component is not twisted, since precessional amplitude is proportional to the angle between the DC field and the dipole moment. But since the slight inhomogeneity of the DC field, as here artificially applied, has no effect on the parallel component of the magnetization, such component (and the nuclei associated therewith) are ready for the onset of the next polarization period.

That is to say, only a sequence of 90° RF magnetic pulses 82 of FIG. 3 under control of the computer-controller 36 is required for satisfactory operations of the present invention. Result: A series of NMR responses 85 can be quickly and accurately detected over a short period of time.

As previously mentioned, while the inhomogeneity of the DC field (as provided by coils 34C) can be compensated by controlling the amplitude of the RF interrogation pulses 82; note that such inhomogeneity is instrumental in eliminating unwanted response "echoes" during subsequent magnetization build-ups. This is because the slight inhomogeneity of the DC field cause the nuclei to experience slightly different DC fields (from part-to-part within the sample volume). Ultimately, each such part (after interrogation) rotates at a slightly different rate of precession.

Further, accumulated effects of refocusing ("echoes") for shorter time magnetization build-ups is likewise minimized by randomly changing the starting point of each measuring sequence. That is, the start position of the angular phase of the perpendicular component of magnetization is changed in a random manner due to the background phase jitter inherent in the generation of the RF interrogation pulses 82. Result: Even though the perpendicular component may be of constant amplitude and constant frequency of precession, its initial start point occurs at a different phase angle each measuring cycle, as the characteristics and performance parameters of oscillator-master clock 40, gate network 38, trigger circuit 39, and pulser 41 randomly change with time.

In this regard, it should be noted that pulse amplitude 84 and pulse width 83 are interrelated in that they must effect reorientation of the magnetization components as previously described for precession about DC field 80. In this regard, the product of amplitude and pulse width should be equal to approximately $\pi/\gamma \times Z$ where $\gamma$ is the magnetogyric ratio and Z is a number between 0.1 and 20 but preferably about $\frac{1}{2}$.

Sample Preparation

Rock samples obtained in the manner depicted in FIG. 1 or mechanically extracted from a core cut from the earth during drilling, are cleansed as discussed below.

If the samples have no visible oil traces in their outer surfaces, simple immersion in a 1% NaCl aqueous solution is usually sufficient. Removal of air (from within their pores) may be helpful, as done by a conventional air evacuation system. Cleansed samples (after pat drying) are inserted to a depth of about 6 mm within coil 34A. Sample volume is a little over 0.3 cubic cm. However, since the chips are irregular in shape, they may occupy only about half the space.

If the samples have some oil at their outer surfaces (a common occurrence if they come from a formation penetrated by a well whose circulating fluid was an oil-base drilling mud or if the sample is from an oil-containing zone), cleaning can be a bit more difficult. But applying conventional dry cleaning fluids to the oil "stains" seems to solve the problem. Then saline immersion, followed by air evacuation and pat drying, provide adequately cleansed samples for testing in accordance with the present invention.

Conclusion

In accordance with the present invention, a series of NMR measurements provides indications of flow properties of the associated rock samples in those instances where an artificial DC field inhomogeneity must be created. Although analysis is not simple (because if the porous rock contains water, the water acts as a "catalyst," speeding up both the magnetization build-up and relaxation reactions), the present invention provides surprisingly accurate results under such circumstances.

One skilled in the art should realize that as little as two separate NMR responses can define a relaxation curve for the hydrogen nuclei undergoing examination, although more sophisticated techniques are available, see for example, my applications, previously cited. What is usually provided is a quantity which is proportional to the difference in nuclear magnetization at finite times from the equilibrium, say at least two normalized instances of time. Whether or not the magnetization being measured is building up to an equilibrium value or is dying down from the equilibrium value makes little difference. It is the difference or distance from equilibrium that can be plotted for any relaxation plot desired.

While permeability expressions have been previously developed and are quite good, in order to give a more general expression, the following equations have been empirically developed.

$$\log_{10}(\text{pern}) = 5\log_{10}(\phi/10) + \log_{10}(F_{20}) + 0.9(F_{20}+F_{80}) \quad (1)$$

where $\phi$ is the porosity in percent, calculated as described below, and $F_t = (S_\infty^* - S_t^*)/S_\infty^*$, where $S_t^*$ is the signal, corrected for noise, and t is the polarizing time, in milliseconds.

If (1) in logarithmic form is not needed, another form is available:

$$\text{pern} = (\phi/10)^5 F_{20} 10^{0.9(F_{20}+F_{80})} \quad (1\text{-a})$$

If means of computing exponentials to the natural base, e, is available, another form can be used, to wit:

$$\text{pern} = (\phi/10)^5 F_{20} \exp[2(F_{20}+F_{80})] \quad (1\text{-b})$$

Of course, if the sample cores are available, the above equations can be further altered in light of data observable from testing of such cores. In that way, new permeability formulas can be especially developed for specific geologic situations.

Likewise, porosity is the ratio of pore volume of total rock volume including pore volume, or $$\text{porosity} = \phi = \frac{\text{pore volume}}{\text{pore volume} + \text{solid volume}} \quad (2)$$

Pore volume is proportional to $S_\infty^*$. If brine is added to the sample containing the brine-saturated rock to bring the level up to some standard mark, and a reading is taken with sufficiently long polarizing time to get the maximum value, a reading, $S_{r+b}$, sufficiently large that the correction for noise can be omitted, is obtained. Here, "r" stands for "rock," and "b" stands for "brine." Likewise, if an identical sample tube is filled with only brine (to an identical mark), a reading, $S_b$, which is also large enough so that the noise correction can be omitted, is also obtained. The difference between these two readings, $S_b - S_{r+b}$ indicates the pore space of the sample has brine everywhere except in the region occupied by the solid material of the sample. Thus, porosity can be indicated, as follows:

$$\text{porosity} = \phi = \frac{(S_\infty)}{[S_\infty^* + (S_b - S_{r+b})]} \quad (3)$$

When the sample is associated with a well drilled with an oil-based drilling mud or is taken from an oil zone, the pores of the sample must be cleansed of oil and reconstituted with brine, before measurements can occur, starting with a kerosene bath, followed by a pair of naphtha baths, a bath of 50% acetone and ending with two acetone baths in succession. After the chips are dried, they are injected with brine using vacuum-induced saturation in which the chips immersed in brine in effect allow the brine to be drawn within their pores as they undergo evacuation.

It should be noted that as the magnetization build-up interval increases from very small values to very large values, the signal increases until the interval is of the order of 6 relaxation times after which further increases do not lead to increases in response. For instance, the NMR responses found in the interval build-up of 100, 200, 300 and 400 milliseconds of a particular sandstones sample, have been stuided. Signals provided for build-up of 100 milliseconds are only slightly smaller than the others. The above value, corrected for noise, is proportional to the amount of hydrogen within the pore space of the sample, and is directly related to porosity, (It's usually called the "NMR infinite response" of the sample.) Resulting signal differences multiplied by a convenient constant can be plotted on semi-log graph paper to produce the relaxation curve previously described, i.e., R relaxation (T) is equal to $S_f \div S_\infty = 1 - S_t \div S_\infty$.

All specific embodiments of the invention have been described in detail, and it should be understood that the invention is not limited thereto as many variations will be readily apparent to those skilled in the art. Thus, the invention is to be given the broadest possible interpretation within the terms of the following claims.

I claim:

1. Automatic apparatus for swiftly determining fluid-flow properties of a rock sample based on NMR response of hydrogen nuclei of interstitial fluids within pore spaces of said samples in which DC field inhomogeneity must be artificially introduced in order to increase data-throughput efficiency (DTE) comprising:
   (a) magnet means for producing a DC magnetic field acting on said rock sample, said magnetic field having an intensity of at least 1 kilogauss to aid in providing a series of nuclear magnetization build-ups associated with said interstitial fluids within said sample as a function of time;
   (b) RF coil means acting at right angles to said DC magnetic field;
   (c) transmitter means including digital control means for generating a first series of digital control codes associated with a series of RF magnetic pulses of selected frequency, amplitude and duration, connected to said RF coil means to produce said series of RF magnetic pulses for interrogating said sample;
   (d) gradient DC coil means connected to said digital control means for generating a series of DC magnetic gradient fields across said sample as a function of a second series of control pulses so as to artificially introduce a DC field inhomogeneity of D gauss across said sample;
   (e) said amplitude of each pulse of (c) being controlled to be at least greater than the variation D in said DC field over of said sample;
   (f) receiver means connected to said digital control means and to said RF coil means for generating aided via a third series of digital control codes associated with opening and closing of a plurality of time windows output signals proportional to said nuclear magnetic resonance response of said interstitial fluids;
   (g) said transmitter means including said digital control means being employed so that said sample can be repetitively interrogated to serially indicate nuclear magnetization relaxation without need for applying rescrambling reversing RF magnetic field pulses prior to the start of each magnetization build-up cycle.

2. The apparatus of claim 1 wherein first series of control codes generated by said digital control means cause the rate of repetition of said transmitter means to change between at least two series of selected repetition values whereby fluid-flow properties of said sample can be determined.

3. The apparatus of claim 2 wherein said receiver means is connected in series with an integrator circuit and wherein said second series of control codes generated by said control means normalize said NMR responses over a plurality of said time windows to attain first and second statistically-improved signals representing magnetization relaxations for different sets of time intervals between interrogation pulses.

4. The apparatus of claim 3 wherein said integrator circuit integrates said NMR responses in accordance with said second series of control codes over each of said plurality of time windows to obtain at least an improved signal representing the normalized nuclear magnetization relaxation in said DC magnetic field between application of said RF magnetic interrogation pulses.

5. The apparatus of claim 4 wherein said integrator circuit is connected to a display means.

6. The apparatus of claim 1 wherein the inhomogeneity of said total DC magnetic field introduced by (d) aids in preventing refocusing of prior generated NMR signals during subsequent magnetization build-ups, especially at long polarizing periods.

7. A method for swiftly determining fluid-flow properties of a rock sample based on nuclear magnetic resonance (NMR) response of hydrogen nuclei of interstitial fluids within said sample in which DC field inhomogeneity must be artificially introduced in order to increase data-throughput efficiency (DTE) comprising:
   (a) storing digital control codes associated with (i) a series of interrogation RF magnetic pulses of selected frequency, duration and magnitude; (ii) a plurality of time windows for detection of a plurality of NMR response signals; and (iii) a series of DC gradient field control pulses for artificially introducing—on a discontinuous digital basis—a DC field inhomogeneity of D gauss across said sample;
   (b) placing the rock sample in a steady DC magnetic field having a strength of at least 1 kilogauss to provide a series of nuclear magnetization build-ups associated with said interstitial fluids;
   (c) under control of said control codes, subjecting said sample to a series of DC gradient fields, so as to artificially introduce to the steady DC field of (b), an inhomogeneity of D gauss across the sample;
   (d) under control of said control codes, subjecting said sample to interrogation by said series of RF magnetic field pulses having said selected frequency, duration and magnitude values to cause reorientation of each of said series of built-up magnetizations, the magnitude of each of said pulses being greater than the variation D in strength in said total DC field of (b) over said sample; and (e) automatically detecting after interrogation in accordance with said control codes, said plurality of nuclear magnetic resonance (NMR) signals indicative of nuclear magnetization relaxation, each of said NMR signals occurring between pulses of said RF magnetic field without need for application of reversing RF field pulses prior to the start of each magnetization build-up cycle.

8. Method of claim 7 in which the steps involving (i) application of said series of RF interrogation pulses and (ii) detection of NMR signals indicative of nuclear magnetization relaxation as a function of time without need for applying reversing RF pulses, are due to said artificially introduced DC field inhomogeneity of step (c) preventing refocusing of NMR signal echoes during subsequent measuring intervals.

9. A method for swiftly determining fluid-flow properties based on NMR response of hydrogen nuclei of interstitial fluid within rock samples, which properties may include porosity, permeability, recoverable fluid content, large-pore specific surface, argillaceous specific surface, or any combination or subcombination of these properties, in which DC field inhomogeneity must be artificially introduced to increase data-throughput efficiency (DTE), of a measuring system comprising:

(a) storing digital control codes associated with (i) a series of interrogation RF magnetic pulses of selected frequency duration and magnitude; (ii) a plurality of time windows for detection of a plurality of NMR response signals; and (iii) a series of DC gradient field control pulses for artificially introducing—on a discontinuous digital basis—a total DC field inhomogeneity of D gauss across the sample;

(b) placing the rock sample in a steady DC magnetic field having a strength of at least 1 kilogauss to aid in providing a series of nuclear magnetizations build-ups associated with said interstitial fluid within said rock sample, said each nuclear magnetization having a preferential alignment parallel to said DC magnetic field;

(c) under control means of said control codes, subjecting said sample to a series of DC gradient fields so as to artificially introduce to the DC field of (b), a DC field inhomogeneity of D gauss across the sample;

(d) subjecting said sample on a sequential basis in accordance with said control codes, to said series of RF magnetic pulses to cause reorientation of said magnetization to preferred alignments offset from said DC field, said amplitude of said interrogation pulses being greater than the variation D in strength of said DC field over the sample;

(e) automatically detecting after interrogation, in accordance with said control codes, NMR responses associated with precession of said magnetization build-ups about axes substantially parallel of said DC field magnetic field within said plurality of time windows, each of said windows occurring within an interval between two of said interrogation pulses and within subintervals beginning at a fixed delayed time after cessation of each of said interrogation pulses; and (f) automatically repeating steps (d) through (e) in accordance with different digital control codes whereby a different predetermined average repetition rate for said interrogation pulses is used to obtain at least a second statistically-improved signal representing nuclear magnetization relaxation in said DC magnetic field within at least a different average time interval between said interrogation pulses, whereby flow properties of said sample can be indicated.

10. Method of claim 9 in which said control code of step (d) are characterized by having the product of pulse width and amplitude of each RF pulse interrogating said sample being equal to $\pi/\gamma \times Z$ where $\gamma$ is the magnetogyric ratio and Z is any number.

11. The method of claim 10 in which Z is between 0.1 and 20.

12. The method of claim 10 in which Z is about $\frac{1}{2}$.

13. Method of claim 10 in which step (f) involving repeating steps (d)–(e) is followed by the step of analyzing relative rates of magnetization relaxation as a function of time to thereby indicate fluid-flow properties of said sample.

14. The method of claim 13 in which one of the fluid-flow properties analyzed for is permeability.

15. Method of claim 10 in which step (f) involving repeating steps (d)–(e) is followed by the step of analyzing relative amplitudes of magnetization relaxation as a function of time to thereby indicate a fluid-flow property of said sample.

16. The method of claim 15 in which the fluid-flow property analyzed for is porosity.

* * * * *